United States Patent
Liang et al.

(10) Patent No.: US 8,445,078 B2
(45) Date of Patent: May 21, 2013

(54) LOW TEMPERATURE SILICON OXIDE CONVERSION

(75) Inventors: Jingmei Liang, San Jose, CA (US);
Nitin K. Ingle, San Jose, CA (US);
Sukwon Hong, San Jose, CA (US);
Anjana M. Patel, San Jose, CA (US)

(73) Assignee: Applied Materials, Inc., Santa Clara, CA (US)

( * ) Notice: Subject to any disclaimer, the term of this patent is extended or adjusted under 35 U.S.C. 154(b) by 0 days.

(21) Appl. No.: 13/237,131

(22) Filed: Sep. 20, 2011

(65) Prior Publication Data
US 2012/0269989 A1    Oct. 25, 2012

Related U.S. Application Data

(60) Provisional application No. 61/477,515, filed on Apr. 20, 2011.

(51) Int. Cl.
*H05H 1/24*    (2006.01)
(52) U.S. Cl.
USPC ................ 427/579; 427/248.1; 427/569
(58) Field of Classification Search
USPC ...................... 427/579, 248.1, 569
See application file for complete search history.

(56) References Cited

U.S. PATENT DOCUMENTS

| | | | |
|---|---|---|---|
| 4,147,571 A | 4/1979 | Stringfellow et al. |
| 4,200,666 A | 4/1980 | Reinberg |
| 4,816,098 A | 3/1989 | Davis et al. |
| 4,818,326 A | 4/1989 | Liu et al. |
| 4,910,043 A | 3/1990 | Freeman et al. |
| 4,931,354 A | 6/1990 | Wakino et al. |
| 4,946,593 A | 8/1990 | Pinigis |
| 5,016,332 A | 5/1991 | Reichelderfer et al. |
| 5,110,407 A | 5/1992 | Ono et al. |
| 5,212,119 A | 5/1993 | Hah et al. |
| 5,271,972 A | 12/1993 | Kwok et al. |
| 5,279,784 A | 1/1994 | Bender et al. |

(Continued)

FOREIGN PATENT DOCUMENTS

| | | |
|---|---|---|
| DE | 19654737 A1 | 7/1997 |
| EP | 0892083 A1 | 1/1999 |

(Continued)

OTHER PUBLICATIONS

Aylett, B. J. et al., "Silicon-Nitrogen Compounds. Part V. Diphenylamino-derivatives of Silane," J. Chem. Soc. (A), Apr. 1969, pp. 636-638.

(Continued)

*Primary Examiner* — Elizabeth Burkhart
(74) *Attorney, Agent, or Firm* — Kilpatrick Townsend & Stockton, LLP

(57) ABSTRACT

A method of forming a silicon oxide layer is described. The method first deposits a silicon-nitrogen-and-hydrogen-containing (polysilazane) film by radical-component chemical vapor deposition (CVD). The polysilazane film is converted to silicon oxide by exposing the polysilazane film to humidity at low substrate temperature. The polysilazane film may also be dipped in a liquid having both oxygen and hydrogen, such as water, hydrogen peroxide and or ammonium hydroxide. These conversion techniques may be used separately or in a sequential combination. Conversion techniques described herein hasten conversion, produce manufacturing-worthy films and remove the requirement of a high temperature oxidation treatment. An ozone treatment may precede the conversion technique(s).

11 Claims, 5 Drawing Sheets

U.S. PATENT DOCUMENTS

| | | |
|---|---|---|
| 5,393,708 A | 2/1995 | Hsia et al. |
| 5,426,076 A | 6/1995 | Moghadam |
| 5,434,109 A | 7/1995 | Geissler et al. |
| 5,468,687 A | 11/1995 | Carl et al. |
| 5,485,420 A | 1/1996 | Lage et al. |
| 5,530,293 A | 6/1996 | Cohen et al. |
| 5,547,703 A | 8/1996 | Camilletti et al. |
| 5,558,717 A | 9/1996 | Zhao et al. |
| 5,578,532 A | 11/1996 | van de Ven et al. |
| 5,587,014 A | 12/1996 | Iyechika et al. |
| 5,593,741 A | 1/1997 | Ikeda |
| 5,620,525 A | 4/1997 | van de Ven et al. |
| 5,622,784 A | 4/1997 | Okaue et al. |
| 5,635,409 A | 6/1997 | Moslehi |
| 5,665,643 A | 9/1997 | Shin |
| 5,691,009 A | 11/1997 | Sandhu |
| 5,769,951 A | 6/1998 | van de Ven et al. |
| 5,786,263 A | 7/1998 | Perera |
| 5,811,325 A | 9/1998 | Lin et al. |
| 5,843,233 A | 12/1998 | van de Ven et al. |
| 5,853,607 A | 12/1998 | Zhao et al. |
| 5,882,417 A | 3/1999 | van de Ven et al. |
| 5,925,411 A | 7/1999 | van de Ven et al. |
| 5,935,340 A | 8/1999 | Xia et al. |
| 5,937,308 A | 8/1999 | Gardner et al. |
| 5,937,323 A | 8/1999 | Orczyk et al. |
| 6,008,515 A | 12/1999 | Hsia et al. |
| 6,009,830 A | 1/2000 | Li et al. |
| 6,014,979 A | 1/2000 | Van Autryve et al. |
| 6,017,791 A | 1/2000 | Wang et al. |
| 6,024,044 A | 2/2000 | Law et al. |
| 6,087,243 A | 7/2000 | Wang |
| 6,090,442 A | 7/2000 | Klaus et al. |
| 6,090,723 A | 7/2000 | Thakur et al. |
| 6,114,219 A | 9/2000 | Spikes et al. |
| 6,121,130 A | 9/2000 | Chua et al. |
| 6,140,242 A | 10/2000 | Oh et al. |
| 6,146,970 A | 11/2000 | Witek et al. |
| 6,150,286 A | 11/2000 | Sun et al. |
| 6,156,394 A | 12/2000 | Yamasaki et al. |
| 6,156,581 A | 12/2000 | Vaudo et al. |
| 6,165,834 A | 12/2000 | Agarwal et al. |
| 6,180,490 B1 | 1/2001 | Vassiliev et al. |
| 6,187,682 B1 | 2/2001 | Denning et al. |
| 6,191,004 B1 | 2/2001 | Hsiao |
| 6,207,587 B1 | 3/2001 | Li et al. |
| 6,258,690 B1 | 7/2001 | Zenke |
| 6,287,962 B1 | 9/2001 | Lin |
| 6,302,964 B1 | 10/2001 | Umotoy et al. |
| 6,383,954 B1 | 5/2002 | Wang et al. |
| 6,387,207 B1 | 5/2002 | Janakiraman et al. |
| 6,406,677 B1 | 6/2002 | Carter et al. |
| 6,413,583 B1 | 7/2002 | Moghadam et al. |
| 6,448,187 B2 | 9/2002 | Yau et al. |
| 6,469,283 B1 | 10/2002 | Burkhart et al. |
| 6,503,557 B1 | 1/2003 | Joret |
| 6,506,253 B2 | 1/2003 | Sakuma |
| 6,508,879 B1 | 1/2003 | Hashimoto |
| 6,509,283 B1 | 1/2003 | Thomas |
| 6,524,931 B1 | 2/2003 | Perera |
| 6,528,332 B2 | 3/2003 | Mahanpour et al. |
| 6,544,900 B2 | 4/2003 | Raaijmakers et al. |
| 6,548,416 B2 | 4/2003 | Han et al. |
| 6,548,899 B2 | 4/2003 | Ross |
| 6,559,026 B1 | 5/2003 | Rossman et al. |
| 6,566,278 B1 | 5/2003 | Harvey et al. |
| 6,583,063 B1 | 6/2003 | Khan et al. |
| 6,589,868 B2 | 7/2003 | Rossman |
| 6,596,654 B1 | 7/2003 | Bayman et al. |
| 6,599,839 B1 | 7/2003 | Gabriel et al. |
| 6,602,806 B1 | 8/2003 | Xia et al. |
| 6,614,181 B1 | 9/2003 | Harvey et al. |
| 6,624,064 B1 | 9/2003 | Sahin et al. |
| 6,630,413 B2 | 10/2003 | Todd |
| 6,645,303 B2 | 11/2003 | Frankel et al. |
| 6,656,804 B2 | 12/2003 | Tsujikawa et al. |
| 6,660,391 B1 | 12/2003 | Rose et al. |
| 6,667,553 B2 | 12/2003 | Cerny et al. |
| 6,670,284 B2 | 12/2003 | Yin |
| 6,676,751 B2 | 1/2004 | Solomon et al. |
| 6,682,659 B1 | 1/2004 | Cho et al. |
| 6,682,969 B1 | 1/2004 | Basceri et al. |
| 6,683,364 B2 | 1/2004 | Oh et al. |
| 6,706,634 B1 | 3/2004 | Seitz et al. |
| 6,716,770 B2 | 4/2004 | O'Neill et al. |
| 6,756,085 B2 | 6/2004 | Waldfried et al. |
| 6,762,126 B2 | 7/2004 | Cho et al. |
| 6,787,191 B2 | 9/2004 | Hanahata et al. |
| 6,794,290 B1 | 9/2004 | Papasouliotis et al. |
| 6,800,571 B2 | 10/2004 | Cheung et al. |
| 6,818,517 B1 | 11/2004 | Maes |
| 6,819,886 B2 | 11/2004 | Runkowske et al. |
| 6,830,624 B2 | 12/2004 | Janakiraman et al. |
| 6,833,052 B2 | 12/2004 | Li et al. |
| 6,833,322 B2 | 12/2004 | Anderson et al. |
| 6,835,278 B2 | 12/2004 | Selbrede et al. |
| 6,849,520 B2 | 2/2005 | Kim et al. |
| 6,858,523 B2 | 2/2005 | DeBoer et al. |
| 6,858,533 B2 | 2/2005 | Chu et al. |
| 6,867,086 B1 | 3/2005 | Chen et al. |
| 6,872,323 B1 | 3/2005 | Entley et al. |
| 6,890,403 B2 | 5/2005 | Cheung |
| 6,900,067 B2 | 5/2005 | Kobayashi et al. |
| 6,955,836 B2 | 10/2005 | Kumagai et al. |
| 6,958,112 B2 | 10/2005 | Karim et al. |
| 7,018,902 B2 | 3/2006 | Visokay et al. |
| 7,077,904 B2 | 7/2006 | Cho et al. |
| 7,084,076 B2 | 8/2006 | Park et al. |
| 7,087,497 B2 | 8/2006 | Yuan et al. |
| 7,109,114 B2 | 9/2006 | Chen et al. |
| 7,115,419 B2 | 10/2006 | Suzuki |
| 7,122,222 B2 | 10/2006 | Xiao et al. |
| 7,129,185 B2 | 10/2006 | Aoyama et al. |
| 7,148,155 B1 | 12/2006 | Tarafdar et al. |
| 7,176,144 B1 | 2/2007 | Wang et al. |
| 7,183,177 B2 | 2/2007 | Al-Bayati et al. |
| 7,192,626 B2 | 3/2007 | Dussarrat et al. |
| 7,205,248 B2 | 4/2007 | Li et al. |
| 7,220,461 B2 | 5/2007 | Hasebe et al. |
| 7,297,608 B1 | 11/2007 | Papasouliotis et al. |
| 7,335,609 B2 | 2/2008 | Ingle et al. |
| 7,399,388 B2 | 7/2008 | Moghadam et al. |
| 7,419,903 B2 | 9/2008 | Haukka et al. |
| 7,435,661 B2 | 10/2008 | Miller et al. |
| 7,456,116 B2 | 11/2008 | Ingle et al. |
| 7,498,273 B2 | 3/2009 | Mallick et al. |
| 7,521,378 B2 * | 4/2009 | Fucsko et al. .................. 438/781 |
| 7,524,735 B1 | 4/2009 | Gauri et al. |
| 7,524,750 B2 | 4/2009 | Nemani et al. |
| 7,541,297 B2 | 6/2009 | Mallick et al. |
| 7,745,352 B2 | 6/2010 | Mallick et al. |
| 7,749,574 B2 | 7/2010 | Mahajani et al. |
| 7,790,634 B2 | 9/2010 | Munro et al. |
| 7,803,722 B2 | 9/2010 | Liang |
| 7,825,038 B2 | 11/2010 | Ingle et al. |
| 7,825,044 B2 | 11/2010 | Mallick et al. |
| 7,867,923 B2 | 1/2011 | Mallick et al. |
| 7,902,080 B2 | 3/2011 | Chen et al. |
| 7,935,643 B2 | 5/2011 | Liang et al. |
| 7,943,531 B2 | 5/2011 | Nemani et al. |
| 7,989,365 B2 | 8/2011 | Park et al. |
| 7,994,019 B1 | 8/2011 | Kweskin et al. |
| 8,129,555 B2 | 3/2012 | Cheng et al. |
| 8,232,176 B2 | 7/2012 | Lubomirsky et al. |
| 8,236,708 B2 | 8/2012 | Kweskin et al. |
| 8,242,031 B2 | 8/2012 | Mallick et al. |
| 8,304,351 B2 | 11/2012 | Wang et al. |
| 8,318,584 B2 | 11/2012 | Li et al. |
| 2001/0021595 A1 | 9/2001 | Jang et al. |
| 2001/0029114 A1 | 10/2001 | Vulpio et al. |
| 2001/0038919 A1 | 11/2001 | Berry et al. |
| 2001/0042511 A1 | 11/2001 | Liu et al. |
| 2001/0048980 A1 | 12/2001 | Kishimoto et al. |
| 2001/0054387 A1 | 12/2001 | Frankel et al. |
| 2001/0055889 A1 | 12/2001 | Iyer |
| 2002/0048969 A1 | 4/2002 | Suzuki et al. |
| 2002/0068416 A1 | 6/2002 | Hsieh et al. |

| | | |
|---|---|---|
| 2002/0068466 A1 | 6/2002 | Lee et al. |
| 2002/0079523 A1 | 6/2002 | Zheng et al. |
| 2002/0081817 A1 | 6/2002 | Bhakta et al. |
| 2002/0086166 A1 | 7/2002 | Hendricks et al. |
| 2002/0127350 A1 | 9/2002 | Ishikawa et al. |
| 2002/0129769 A1 | 9/2002 | Kim et al. |
| 2002/0142585 A1 | 10/2002 | Mandal |
| 2002/0146879 A1 | 10/2002 | Fu et al. |
| 2002/0164429 A1 | 11/2002 | Gaillard et al. |
| 2002/0164891 A1 | 11/2002 | Gates et al. |
| 2002/0177298 A1 | 11/2002 | Konishi et al. |
| 2002/0182893 A1 | 12/2002 | Ballantine et al. |
| 2003/0001201 A1 | 1/2003 | Yuzuriha et al. |
| 2003/0023113 A1 | 1/2003 | Druzkowski et al. |
| 2003/0040199 A1 | 2/2003 | Agarwal |
| 2003/0064154 A1 | 4/2003 | Laxman et al. |
| 2003/0077918 A1 | 4/2003 | Wu et al. |
| 2003/0113992 A1 | 6/2003 | Yau et al. |
| 2003/0118748 A1 | 6/2003 | Kumagai et al. |
| 2003/0124873 A1 | 7/2003 | Xing et al. |
| 2003/0143841 A1 | 7/2003 | Yang et al. |
| 2003/0159656 A1 | 8/2003 | Tan et al. |
| 2003/0172872 A1 | 9/2003 | Thakur et al. |
| 2003/0194881 A1 | 10/2003 | Totsuka et al. |
| 2003/0199151 A1 | 10/2003 | Ho et al. |
| 2003/0232495 A1 | 12/2003 | Moghadam et al. |
| 2004/0008334 A1 | 1/2004 | Sreenivasan et al. |
| 2004/0020601 A1 | 2/2004 | Zhao et al. |
| 2004/0029352 A1 | 2/2004 | Beyer et al. |
| 2004/0029353 A1 | 2/2004 | Zheng et al. |
| 2004/0048492 A1 | 3/2004 | Ishikawa et al. |
| 2004/0065253 A1 | 4/2004 | Pois et al. |
| 2004/0079118 A1 | 4/2004 | M'Saad et al. |
| 2004/0082131 A1 | 4/2004 | Tsujikawa et al. |
| 2004/0110354 A1 | 6/2004 | Natzle et al. |
| 2004/0139983 A1 | 7/2004 | Lakshmanan et al. |
| 2004/0146661 A1 | 7/2004 | Kapoor et al. |
| 2004/0152342 A1 | 8/2004 | Li et al. |
| 2004/0161899 A1 | 8/2004 | Luo et al. |
| 2004/0166680 A1 | 8/2004 | Miyajima et al. |
| 2004/0175501 A1 | 9/2004 | Lukas et al. |
| 2004/0180557 A1 | 9/2004 | Park et al. |
| 2004/0185641 A1 | 9/2004 | Tanabe et al. |
| 2004/0194706 A1 | 10/2004 | Wang et al. |
| 2004/0197843 A1 | 10/2004 | Chou et al. |
| 2004/0216844 A1 | 11/2004 | Janakiraman et al. |
| 2004/0219780 A1 | 11/2004 | Ohuchi |
| 2004/0231590 A1 | 11/2004 | Ovshinsky |
| 2004/0241342 A1 | 12/2004 | Karim et al. |
| 2005/0001556 A1 | 1/2005 | Hoffman et al. |
| 2005/0014354 A1 | 1/2005 | Ozawa et al. |
| 2005/0019494 A1 | 1/2005 | Moghadam et al. |
| 2005/0026443 A1 | 2/2005 | Goo et al. |
| 2005/0062165 A1 | 3/2005 | Saenger et al. |
| 2005/0087140 A1 | 4/2005 | Yuda et al. |
| 2005/0118794 A1 | 6/2005 | Babayan et al. |
| 2005/0121145 A1 | 6/2005 | Du Bois et al. |
| 2005/0142895 A1 | 6/2005 | Ingle et al. |
| 2005/0153574 A1 | 7/2005 | Mandal |
| 2005/0181555 A1 | 8/2005 | Haukka et al. |
| 2005/0186731 A1 | 8/2005 | Derderian et al. |
| 2005/0186789 A1 | 8/2005 | Agarwal |
| 2005/0196533 A1 | 9/2005 | Hasebe et al. |
| 2005/0196935 A1 | 9/2005 | Ishitsuka et al. |
| 2005/0196977 A1 | 9/2005 | Saito et al. |
| 2005/0224866 A1 | 10/2005 | Higashi et al. |
| 2005/0227017 A1 | 10/2005 | Senzaki et al. |
| 2005/0227499 A1 | 10/2005 | Park et al. |
| 2005/0230350 A1 | 10/2005 | Kao et al. |
| 2005/0233595 A1 | 10/2005 | Choi et al. |
| 2005/0250340 A1 | 11/2005 | Chen et al. |
| 2005/0257890 A1 | 11/2005 | Park et al. |
| 2005/0260347 A1 | 11/2005 | Narwankar et al. |
| 2006/0011984 A1 | 1/2006 | Currie |
| 2006/0014399 A1 | 1/2006 | Joe |
| 2006/0030151 A1 | 2/2006 | Ding et al. |
| 2006/0030165 A1 | 2/2006 | Ingle et al. |
| 2006/0046427 A1 | 3/2006 | Ingle et al. |
| 2006/0046506 A1 | 3/2006 | Fukiage |
| 2006/0055004 A1 | 3/2006 | Gates et al. |
| 2006/0068599 A1 | 3/2006 | Baek et al. |
| 2006/0075966 A1 | 4/2006 | Chen et al. |
| 2006/0088985 A1 | 4/2006 | Haverkort et al. |
| 2006/0090694 A1 | 5/2006 | Cho et al. |
| 2006/0091104 A1 | 5/2006 | Takeshita et al. |
| 2006/0096540 A1 | 5/2006 | Choi |
| 2006/0102977 A1 | 5/2006 | Fucsko et al. |
| 2006/0110939 A1 | 5/2006 | Joshi et al. |
| 2006/0110943 A1 | 5/2006 | Swerts et al. |
| 2006/0121394 A1 | 6/2006 | Chi |
| 2006/0159847 A1 | 7/2006 | Porter et al. |
| 2006/0162661 A1 | 7/2006 | Jung et al. |
| 2006/0178018 A1 | 8/2006 | Olsen |
| 2006/0223315 A1 | 10/2006 | Yokota et al. |
| 2006/0228903 A1 | 10/2006 | McSwiney et al. |
| 2006/0252240 A1 | 11/2006 | Gschwandtner et al. |
| 2006/0281496 A1 | 12/2006 | Cedraeus |
| 2006/0286774 A1 | 12/2006 | Singh et al. |
| 2006/0286776 A1 | 12/2006 | Ranish et al. |
| 2007/0004170 A1 | 1/2007 | Kawasaki et al. |
| 2007/0020392 A1 | 1/2007 | Kobrin et al. |
| 2007/0026689 A1 | 2/2007 | Nakata et al. |
| 2007/0031598 A1 | 2/2007 | Okuyama et al. |
| 2007/0031609 A1 | 2/2007 | Kumar et al. |
| 2007/0032054 A1 | 2/2007 | Ramaswamy et al. |
| 2007/0049044 A1 | 3/2007 | Marsh |
| 2007/0066022 A1 | 3/2007 | Chen et al. |
| 2007/0077777 A1 | 4/2007 | Gumpher |
| 2007/0092661 A1 | 4/2007 | Ryuzaki et al. |
| 2007/0099438 A1 | 5/2007 | Ye et al. |
| 2007/0108404 A1 | 5/2007 | Stewart et al. |
| 2007/0128864 A1 | 6/2007 | Ma et al. |
| 2007/0134433 A1 | 6/2007 | Dussarrat et al. |
| 2007/0166892 A1 | 7/2007 | Hori |
| 2007/0173073 A1 | 7/2007 | Weber |
| 2007/0181966 A1 | 8/2007 | Watatani et al. |
| 2007/0232071 A1 | 10/2007 | Balseanu et al. |
| 2007/0232082 A1 | 10/2007 | Balseanu et al. |
| 2007/0275569 A1 | 11/2007 | Moghadam et al. |
| 2007/0281106 A1 | 12/2007 | Lubomirsky et al. |
| 2007/0281448 A1 | 12/2007 | Chen et al. |
| 2007/0281495 A1 | 12/2007 | Mallick et al. |
| 2007/0281496 A1 | 12/2007 | Ingle et al. |
| 2007/0289534 A1 | 12/2007 | Lubomirsky et al. |
| 2007/0298585 A1 | 12/2007 | Lubomirsky et al. |
| 2008/0000423 A1 | 1/2008 | Fukiage |
| 2008/0014759 A1 | 1/2008 | Chua et al. |
| 2008/0026597 A1 | 1/2008 | Munro et al. |
| 2008/0038486 A1 | 2/2008 | Treichel et al. |
| 2008/0063809 A1 | 3/2008 | Lee et al. |
| 2008/0081104 A1 | 4/2008 | Hasebe et al. |
| 2008/0085607 A1 | 4/2008 | Yu et al. |
| 2008/0102223 A1 | 5/2008 | Wagner et al. |
| 2008/0102650 A1 | 5/2008 | Adams et al. |
| 2008/0182382 A1 | 7/2008 | Ingle et al. |
| 2008/0188087 A1 | 8/2008 | Chen et al. |
| 2008/0206954 A1 | 8/2008 | Choi et al. |
| 2008/0241358 A1 | 10/2008 | Joe et al. |
| 2008/0260969 A1 | 10/2008 | Dussarrat et al. |
| 2008/0305648 A1 | 12/2008 | Fukazawa et al. |
| 2008/0318429 A1 | 12/2008 | Ozawa et al. |
| 2009/0031953 A1 | 2/2009 | Ingle et al. |
| 2009/0035917 A1 | 2/2009 | Ahn et al. |
| 2009/0053901 A1 | 2/2009 | Goto et al. |
| 2009/0061647 A1 | 3/2009 | Mallick et al. |
| 2009/0075490 A1 | 3/2009 | Dussarrat |
| 2009/0095714 A1 | 4/2009 | Chen et al. |
| 2009/0104755 A1 | 4/2009 | Mallick et al. |
| 2009/0104789 A1 | 4/2009 | Mallick et al. |
| 2009/0104790 A1* | 4/2009 | Liang ............................ 438/788 |
| 2009/0104791 A1* | 4/2009 | Nemani et al. ................. 438/788 |
| 2009/0104798 A1 | 4/2009 | Hirano |
| 2009/0142935 A1 | 6/2009 | Fukazawa et al. |
| 2009/0194809 A1 | 8/2009 | Cho |
| 2009/0203225 A1 | 8/2009 | Gates et al. |
| 2009/0209081 A1 | 8/2009 | Matero et al. |
| 2009/0215251 A1 | 8/2009 | Vellaikal et al. |
| 2009/0224374 A1 | 9/2009 | Bhatia et al. |

| | | | |
|---|---|---|---|
| 2009/0232985 A1 | 9/2009 | Dussarrat et al. | |
| 2009/0242957 A1 | 10/2009 | Ma et al. | |
| 2009/0277587 A1 | 11/2009 | Lubomirsky et al. | |
| 2009/0280650 A1 | 11/2009 | Lubomirsky et al. | |
| 2009/0289284 A1 | 11/2009 | Goh et al. | |
| 2009/0294925 A1 | 12/2009 | Lin et al. | |
| 2009/0298251 A1 | 12/2009 | Lee et al. | |
| 2009/0325391 A1 | 12/2009 | De Vusser et al. | |
| 2010/0081293 A1 | 4/2010 | Mallick et al. | |
| 2010/0140756 A1 | 6/2010 | Kozasa et al. | |
| 2010/0143609 A1 | 6/2010 | Fukazawa et al. | |
| 2010/0221428 A1 | 9/2010 | Dussarrat | |
| 2010/0221925 A1 | 9/2010 | Lee et al. | |
| 2010/0255655 A1 | 10/2010 | Mallick et al. | |
| 2011/0014798 A1 | 1/2011 | Mallick et al. | |
| 2011/0034035 A1 | 2/2011 | Liang et al. | |
| 2011/0034039 A1* | 2/2011 | Liang et al. | 438/788 |
| 2011/0045676 A1 | 2/2011 | Park et al. | |
| 2011/0111137 A1 | 5/2011 | Liang et al. | |
| 2011/0129616 A1 | 6/2011 | Ingle et al. | |
| 2011/0136347 A1 | 6/2011 | Kovarsky et al. | |
| 2011/0159213 A1 | 6/2011 | Cai et al. | |
| 2011/0159703 A1 | 6/2011 | Liang et al. | |
| 2011/0165347 A1 | 7/2011 | Miller et al. | |
| 2011/0165781 A1 | 7/2011 | Liang et al. | |
| 2011/0217851 A1 | 9/2011 | Liang et al. | |
| 2011/0223774 A1 | 9/2011 | Kweskin et al. | |
| 2012/0003840 A1 | 1/2012 | Wang et al. | |
| 2012/0009802 A1 | 1/2012 | LaVoie et al. | |
| 2012/0079982 A1 | 4/2012 | Lubomirsky et al. | |
| 2012/0083133 A1 | 4/2012 | Solis et al. | |
| 2012/0094468 A1 | 4/2012 | Bhatia et al. | |
| 2012/0094476 A1 | 4/2012 | Tanaka et al. | |
| 2012/0111831 A1 | 5/2012 | Ha | |
| 2012/0142192 A1 | 6/2012 | Li et al. | |
| 2012/0145079 A1 | 6/2012 | Lubomirsky et al. | |
| 2012/0177846 A1 | 7/2012 | Li et al. | |
| 2012/0190178 A1 | 7/2012 | Wang et al. | |
| 2012/0213940 A1 | 8/2012 | Mallick | |
| 2012/0225565 A1 | 9/2012 | Bhatia et al. | |
| 2012/0238108 A1 | 9/2012 | Chen et al. | |
| 2012/0309205 A1 | 12/2012 | Wang et al. | |

FOREIGN PATENT DOCUMENTS

| | | |
|---|---|---|
| EP | 1095958 B1 | 5/2001 |
| EP | 1717848 A | 11/2006 |
| JP | 61-234534 A | 10/1986 |
| JP | 64-048425 A | 2/1989 |
| JP | 1-198033 A | 8/1989 |
| JP | 01-235259 A | 9/1989 |
| JP | 01241826 A | 9/1989 |
| JP | 03-197684 A | 8/1991 |
| JP | 03-286531 | 12/1991 |
| JP | 05-259156 | 10/1993 |
| JP | 05-304147 A | 11/1993 |
| JP | 6-168930 A | 6/1994 |
| JP | 07-014826 A | 1/1995 |
| JP | 07-169762 A | 7/1995 |
| JP | 07-316823 A | 12/1995 |
| JP | 08-236518 A | 9/1996 |
| JP | 08-288286 A | 11/1996 |
| JP | 09-237785 A | 9/1997 |
| JP | 10-163183 A | 6/1998 |
| JP | 11-274285 A | 10/1999 |
| JP | 2001-148382 A | 5/2001 |
| JP | 2002-370059 A | 12/2002 |
| JP | 2004-327639 | 11/2004 |
| JP | 2005-142448 A | 6/2005 |
| JP | 2005-268396 A | 9/2005 |
| JP | 2005-302848 A | 10/2005 |
| JP | 2008-159824 A | 7/2008 |
| JP | 2008/218684 A | 9/2008 |
| JP | 2011-220127 A | 11/2011 |
| KR | 10-2004-0091978 A | 11/2004 |
| KR | 1020040104533 A | 12/2004 |
| KR | 10-2005-0003758 A | 1/2005 |
| KR | 10-2005-0094183 A | 9/2005 |
| KR | 1020060081350 A | 7/2006 |
| KR | 10-2009-0011765 A | 2/2009 |
| KR | 10-2009-0122860 A | 12/2009 |
| TW | 200514163 | 4/2005 |
| TW | 200707582 | 2/2007 |
| WO | WO 02/077320 A1 | 10/2002 |
| WO | WO 03/066933 A | 8/2003 |
| WO | WO 2005/078784 A | 8/2005 |
| WO | WO 2007/040856 A2 | 4/2007 |
| WO | WO 2007/140376 A | 12/2007 |
| WO | WO 2007/140424 A | 12/2007 |
| WO | 2009/055340 A1 | 4/2009 |

OTHER PUBLICATIONS

Aylett, B. J. et al., "Silicon-Nitrogen Compounds. Part VI. The Preparation and Properties of Disilazane," J. Chem. Soc. (A), Apr. 1969, pp. 639-642.

Aylett, B. J. et al., "The Preparation and Some Properties of Disilylamine-Correspondence," Inorganic Chemistry, Jan. 1966, p. 167.

Beach, David B., "Infrared and Mass Spectroscopic Study of the Reaction of Silyl Iodide and Ammonia. Infrared Spectrum to Silylamine," Inorganic Chemistry, Sep. 1992, pp. 4174-4177, vol. 31 No. 20.

Burg, Anton B. et al., "Silyl-Amino Boron Compounds," J. Amer. Chem. Soc., Jul. 1950, pp. 3103-3107, vol. 72.

Coltrin, M.E., et al., "Chemistry of AlGaN Particulate Formation," National Nuclear Security Administration, Physical, Chemical, & Nano Sciences Center, Research Briefs, 2005, pp. 42-43.

Davison, A et al., "The Raman Spectra of Manganese and Rhenium Carbonyl Hydrides and Some Related Species," Inorganic Chemistry, Apr. 1967, pp. 845-847, vol. 6 No. 4.

Dussarrat, C. et al., "Low Pressure Chemical Vapor Deposition of Silicon Nitride Using Mono- and Disilylamine," Chemical Vapor Deposition XVI and EUROCVD 14 vol. 2 Proceedings of the International Symposium, Part of the 203rd Electrochemical Society Meeting in Paris France, Apr. 27-May 2, 2003, 11 pages.

Gulleri, G. et al., "Deposition Temperature Determination of HDPCVD Silicon Dioxide Films," 2005, Microelectronic Engineering, vol. 82, pp. 236-241.

Kang, Hun, "A Study of the Nucleation and Formation of Multi-functional Nanostructures using GaN-Based Materials for Device Applications," Georgia Institute of Technology, Doctor of Philosophy in the School of Electrical & Computer Engineering Dissertation, Dec. 2006, p. 14.

Lee, Eun Gu, et al., "Effects of Wet Oxidation on the Electrical Properties of sub-10 nm thick silicon nitride films", Thin Solid Films, Elsevier-Sequoia S.A. Lausanne, CH. vol. 205, No. 2, Dec. 1, 1991, pp. 246-251.

Lucovsky, G. et al., "Deposition of silicon dioxide and silicon nitride by remote plasma enhanced chemical vapor deposition," Journal of Vacuum Science & Technology, vol. 4, No. 3, May-Jun. 1986, pp. 681-688.

Norman, Arlan D. et al., "Reaction of Silylphosphine with Ammonia," Inoragnic Chemistry, Jun. 1979, pp. 1594-1597, vol. 18 No. 6.

Sujishi, Sei et al., "Effect of Replacement of Carbon by Silicon in Trimethylamine on the Stabilities of the Trimethylboron Addition Compounds. Estimation of the Resonance Energy for Silicon-Nitrogen Partial Double Bond," Amer. Chem. Soc., Sep. 20, 1954, pp. 4631-4636, vol. 76.

Tsu, D. V. et al., "Silicon Nitride and Silicon Diimide Grown by Remote Plasma Enhanced Chemical Vapor Deposition", Journal of Vacuum Science and Technology: Part A, AVS/AIP, Melville, NY.; US, vol. 4, No. 3, Part 01, May 1, 1986, pp. 480-485.

Ward, L. G. L. et al., "The Preparation and Properties of Bis-Disilanyl Sulphide and Tris-Disilanylamine," J. Inorg. Nucl. Chem., Dec. 1961, pp. 287-293, vol. 21, Pergamon Press Ltd., Northern Ireland.

Ward, Laird G. L., "Bromosilane, Iodosilane, and Trisilylamine," Inorganic Syntheses, 1968, pp. 159-170, vol. 11.

Zuckerman, J.J., "Inorganic Reactions and Methods," Formation of Bonds to N, P, As, Sb, Bi (Part 1), ISBN-0-89573-250-5, Jan. 1998, 5 pages, vol. 7, VCH Publishers, Inc., New York.

Alexandrov, S. E., et al., "Formation of Silicon Nitride Films by Remote Plasma-enhanced Chemical Vapour Deposition". Advanced Materials for Optics and Electronics, vol. 2, 301-312 (1993).

Bowen, C., et al., "New Processing Techniques: Sweeping of Quartz Wafers and a Practical Method for Processing Quartz Resonators Under Controlled Conditions," Proceedings of the 1992 IEEE Frequency Control Symposium, pp. 648-656.

International Search Report and Written Opinion of PCT/US2011/054635, mailed Jul. 9, 2012, 11 pages.

International Search Report and Written Opinion of PCT/US2011/054981, mailed May 9, 2012, 10 pages.

International Search Report and Written Opinion of PCT/US2011/054984, mailed May 11, 2012, 10 pages.

International Search Report and Written Opinion of PCT/US2011/066601, mailed Jul. 20, 2012, 10 pages.

Loboda, M.J., et al., "Chemical influence of inert gas on the thin film stress in plasma-enhanced chemical vapor deposited a—SiN:H films". Journal of Materials Research, vol. 11, No. 2, Feb 1996, pp. 391-398.

Franz, et al., "Conversion of silicon nitride into silicon dioxide through the influence of oxygen," Solid-State Electronics, Jun. 1971, pp. 449-505, vol. 14, Issue 6, Germany. Abstract Only.

International Search Report and Written Opinion of PCT/US2011/066275, mailed Sep. 24, 2012, 9 pages.

Tripp, et al., "The Anodic Oxidation of Silicon Nitride Films on Silicon," Journal of the Electrochemical Society, 1970, pp. 157-159, 117(2).

Usenko, et al., "Silicon Nitride Surface Conversion into Oxide to Enable Hydrophilic Bonding," ECS Meeting Abstracts, 2010, 1 page, Abstract #1716, 218th ECS Meeting.

* cited by examiner

LOW TEMPERATURE SILICON OXIDE CONVERSION

CROSS-REFERENCES TO RELATED APPLICATIONS

This application claims the benefit of U.S. Prov. Pat. App. No. 61/477,515 filed Apr. 20, 2011, and titled "LOW TEMPERATURE SILICON OXIDE CONVERSION," which is incorporated herein by reference for all purposes.

BACKGROUND OF THE INVENTION

Semiconductor device geometries have dramatically decreased in size since their introduction several decades ago. Modern semiconductor fabrication equipment routinely produce devices with 45 nm, 32 nm, and 28 nm feature sizes, and new equipment is being developed and implemented to make devices with even smaller geometries. The decreasing feature sizes result in structural features on the device having decreased spatial dimensions. The widths of gaps and trenches on the device narrow to a point where the aspect ratio of gap depth to its width becomes high enough to make it challenging to fill the gap with dielectric material. The depositing dielectric material is prone to clog at the top before the gap completely fills, producing a void or seam in the middle of the gap.

Over the years, many techniques have been developed to avoid having dielectric material clog the top of a gap, or to "heal" the void or seam that has been formed. One approach has been to start with highly flowable precursor materials that may be applied in a liquid phase to a spinning substrate surface (e.g., SOG deposition techniques). These flowable precursors can flow into and fill very small substrate gaps without forming voids or weak seams. However, once these highly flowable materials are deposited, they have to be hardened into a solid dielectric material.

In many instances, the hardening includes a heat treatment to remove carbon and hydroxyl groups from the deposited material to leave behind a solid dielectric such as silicon oxide. Unfortunately, the departing carbon and hydroxyl species often leave behind pores in the hardened dielectric that reduce the quality of the final material. In addition, the hardening dielectric also tends to shrink in volume, which can leave cracks and spaces at the interface of the dielectric and the surrounding substrate. In some instances, the volume of the hardened dielectric can decrease by 40% or more.

Spin-on dielectrics (SOD) have also been used to flow into features on a patterned substrate. The material is generally converted to silicon oxide from a silazane-type film which contains silicon, nitrogen and hydrogen. Silicon, nitrogen and hydrogen containing films are typically converted to silicon oxide at high temperature in an oxygen containing environment. Oxygen from the environment displaces nitrogen and hydrogen to create the silicon oxide film. High temperature exposure to oxygen environments can ruin underlying films for some circuit architectures. This consideration results in the need to stay within a "thermal budget" during a manufacturing process flow. Thermal budget considerations have largely limited SOD to process flows incorporating an underlying silicon nitride layer which can protect underlying features from oxidation (e.g. DRAM applications).

Thus, there is a need for new deposition processes and materials to form dielectric materials on structured substrates without requiring high temperature treatments in an oxygen-containing environment. This and other needs are addressed in the present application.

BRIEF SUMMARY OF THE INVENTION

A method of forming a silicon oxide layer is described. The method first deposits a silicon-nitrogen-and-hydrogen-containing (polysilazane) film by radical-component chemical vapor deposition (CVD). The polysilazane film is converted to silicon oxide by exposing the polysilazane film to humidity at low substrate temperature. The polysilazane film may also be dipped in a liquid having both oxygen and hydrogen, such as water, hydrogen peroxide and or ammonium hydroxide. These conversion techniques may be used separately or in a sequential combination. Conversion techniques described herein hasten conversion, produce manufacturing-worthy films and remove the requirement of a high temperature oxidation treatment. An ozone treatment may precede the conversion technique(s).

Embodiments of the invention include methods of forming a silicon oxide layer on a substrate. The methods include forming a silicon-nitrogen-and-hydrogen-containing layer. Forming the silicon-nitrogen-and-hydrogen-containing layer includes flowing an unexcited precursor into a remote plasma region to produce a radical-precursor, combining a silicon-containing precursor with the radical-precursor in the plasma-free substrate processing region, and depositing the silicon-nitrogen-and-hydrogen-containing layer on the substrate. The methods further include curing the silicon-nitrogen-and-hydrogen-containing layer in an ozone-containing atmosphere to convert the silicon-nitrogen-and-hydrogen-containing layer to a silicon-and-oxygen-containing layer. The methods further include exposing the silicon-and-oxygen-containing layer to a humid atmosphere having at least 50% relative humidity to convert the silicon-and-oxygen-containing layer to the silicon oxide layer.

Embodiments of the invention include methods of forming a silicon oxide layer on a substrate. The methods include forming a silicon-nitrogen-and-hydrogen-containing layer. Forming the silicon-nitrogen-and-hydrogen-containing layer includes flowing an unexcited precursor into a remote plasma region to produce a radical-precursor, combining a silicon-containing precursor with the radical-precursor in the plasma-free substrate processing region, and depositing the silicon-nitrogen-and-hydrogen-containing layer on the substrate. The methods further include curing the silicon-nitrogen-and-hydrogen-containing layer in an ozone-containing atmosphere to convert the silicon-nitrogen-and-hydrogen-containing layer to a silicon-and-oxygen-containing layer. The methods further include dipping the silicon-and-oxygen-containing layer into a liquid solution comprising oxygen and hydrogen to convert the silicon-and-oxygen-containing layer to the silicon oxide layer.

Additional embodiments and features are set forth in part in the description that follows, and in part will become apparent to those skilled in the art upon examination of the specification or may be learned by the practice of the invention. The features and advantages of the invention may be realized and attained by means of the instrumentalities, combinations, and methods described in the specification.

BRIEF DESCRIPTION OF THE DRAWINGS

A further understanding of the nature and advantages of the present invention may be realized by reference to the remaining portions of the specification and the drawings wherein.

DETAILED DESCRIPTION OF THE INVENTION

A method of forming a silicon oxide layer is described. The method first deposits a silicon-nitrogen-and-hydrogen-containing (polysilazane) film by radical-component chemical vapor deposition (CVD). The polysilazane film is converted to silicon oxide by exposing the polysilazane film to humidity at low substrate temperature. The polysilazane film may also be dipped in a liquid having both oxygen and hydrogen, such as water, hydrogen peroxide and or ammonium hydroxide. These conversion techniques may be used separately or in a sequential combination. Conversion techniques described herein hasten conversion, produce manufacturing-worthy films and remove the requirement of a high temperature oxidation treatment. An ozone treatment may precede the conversion technique(s).

Exposing a radical-component CVD silicon-nitrogen-and-hydrogen-containing film to a humid atmosphere has been found to accelerate the completion of the transition to silicon oxide as determined by fourier transform infrared spectroscopy (FTIR). Without exposure to humid atmosphere, the properties and stoichiometry of the film may change over time. Changing film properties complicate the manufacturing process. The exposure of the film to humidity as described herein has been found to quickly and reproducibly bring the film properties to a steady state, characterized by essentially no nitrogen content as determined by FTIR. Polysilazane films deposited using methods other than radical-component CVD have further been found to not achieve a steady state silicon oxide film. This observation may result from the relatively more open network produced by depositions of silicon-and-nitrogen-containing films by, for example mixing a radical precursor with a silicon-containing precursor. The open network may allow moisture to penetrate more deeply within the film. This can extend the oxide conversion in the direction of the substrate. The exposure of a silazane film to moisture has been found to create silicon oxide without the assistance of a relatively high-temperature oxygen-atmosphere treatment. Avoiding high-temperature oxygen treatments is desirable to stay within oxidation budgets thereby improving device yield and performance. Exposing silicon-nitrogen-and-hydrogen-containing films to oxygen and hydrogen containing liquids has also been found to transition the films to silicon oxide at low temperatures.

Many radical-component CVD films converted to silicon oxide according to the methods contained herein have been found to exhibit properties which do not evolve when the substrate is exposed to typical cleanroom atmospheres. Additional details about the methods and systems of forming the silicon oxide layer will now be described.

Exemplary Silicon Oxide Formation Process

Figure 1:
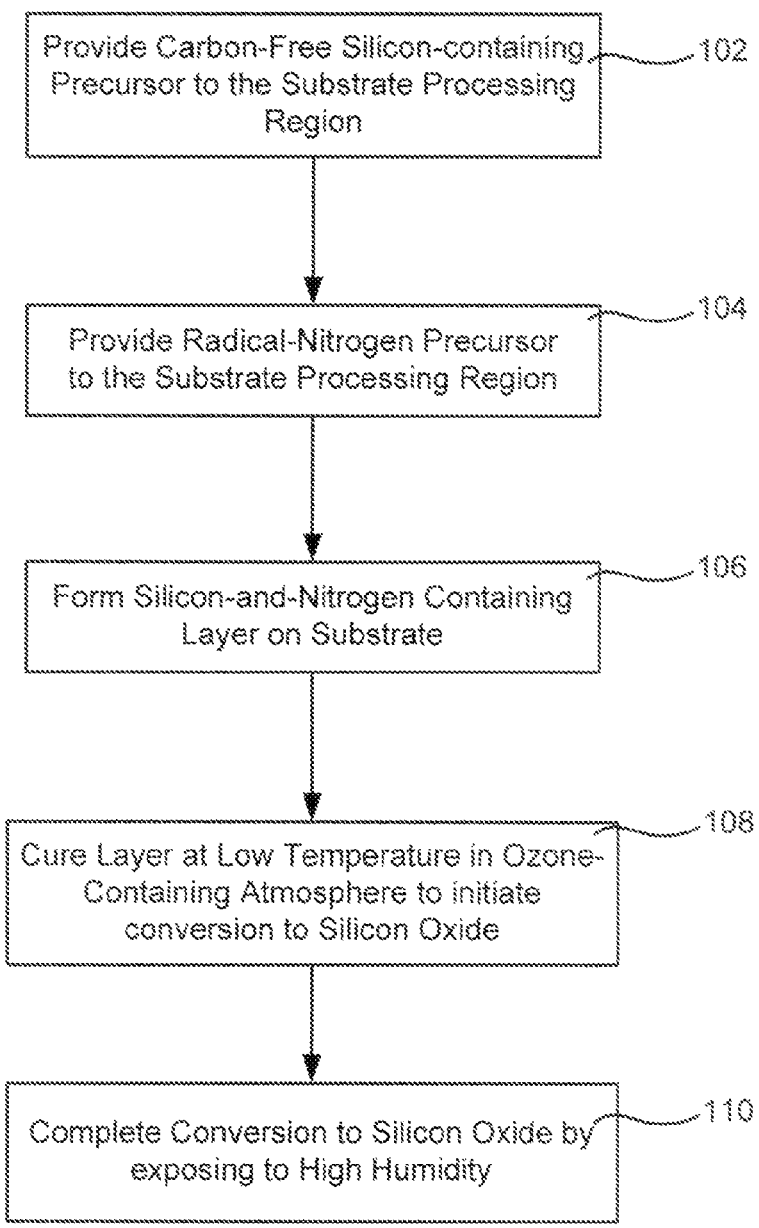
FIG. 1 is a flowchart illustrating selected steps for making a silicon oxide film according to embodiments of the invention.

FIG. 1 is a flowchart showing selected steps in methods 100 of making silicon oxide films according to embodiments of the invention. The method 100 includes providing a silicon-containing precursor to a substrate processing region 102. The silicon-containing precursor does not pass through a plasma excitation, in embodiments, so the precursor travels into the substrate processing region intact. Excitation is then provided only by the radical precursor to be introduced shortly. The silicon-containing precursor may contain some carbon or it may be carbon-free in embodiments of the invention. Silicon-containing precursor may be, for example, a silicon-and-nitrogen-containing precursor, a silicon-and-hydrogen-containing precursor, or a silicon-nitrogen-and-hydrogen-containing precursor, among other classes of silicon precursors. As will be discussed in detail shortly, an absence of carbon reduces the shrinkage of the deposited film. The silicon-containing precursor may be oxygen-free in addition to carbon-free. The lack of oxygen results in a lower concentration of silanol (Si—OH) groups in the silicon-and-nitrogen-containing layer formed from the precursors. Excess silanol moieties in the deposited film can cause increased porosity and shrinkage during post deposition steps that remove the hydroxyl (—OH) moieties from the deposited layer.

Specific examples of carbon-free silicon precursors may include silyl-amines such as $H_2N(SiH_3)$, $HN(SiH_3)_2$, and $N(SiH_3)_3$, among other silyl-amines. The flow rates of a silyl-amine may be greater than or about 200 sccm, greater than or about 300 sccm or greater than or about 500 sccm in different embodiments. All flow rates given herein refer to a dual chamber substrate processing system. Single wafer systems would require half these flow rates and other wafer sizes would require flow rates scaled by the processed area. These silyl-amines may be mixed with additional gases that may act as carrier gases, reactive gases, or both. Examplary additional gases include $H_2$, $N_2$, $NH_3$, He, and Ar, among other gases. Examples of carbon-free silicon-containing precursors may also include silane ($SiH_4$) either alone or mixed with other silicon (e.g., $N(SiH_3)_3$), hydrogen (e.g., $H_2$), and/or nitrogen (e.g., $N_2$, $NH_3$) containing gases. Carbon-free silicon-containing precursors may also include disilane, trisilane, even higher-order silanes, and chlorinated silanes, alone or in combination with one another or the previously mentioned carbon-free silicon-containing precursors.

A radical precursor is also provided to the substrate processing region 104. A radical precursor describes plasma effluents produced in the plasma excitation outside the substrate processing region from any stable species (inert or reactive). The radical precursor may be a nitrogen-containing radical precursor which will be referred to herein as a radical-nitrogen precursor. The radical-nitrogen precursor is a nitrogen-radical-containing precursor that was generated outside the substrate processing region from a more stable nitrogen precursor. A stable precursor may be referred to herein as an unexcited precursor to indicate that the precursor has not yet passed through a plasma. A stable nitrogen precursor compound containing $NH_3$, hydrazine ($N_2H_4$) and/or $N_2$ may be activated in a chamber plasma region or a remote plasma system (RPS) outside the processing chamber to form the radical-nitrogen precursor, which is then transported into the substrate processing region to excite the silicon-containing precursor. The stable nitrogen precursor may also be a mixture comprising $NH_3$ & $N_2$, $NH_3$ & $H_2$, $NH_3$ & $N_2$ & $H_2$ and $N_2$ & $H_2$, in different embodiments. Hydrazine may also be used in place of or in combination with $NH_3$ and in the mixtures involving $N_2$ and $H_2$. The flow rate of the stable nitrogen precursor may be greater than or about 300 sccm, greater than or about 500 sccm or greater than or about 700 sccm in different embodiments. The radical-nitrogen precursor produced in the chamber plasma region may be one or more of .N, .NH, $.NH_2$, etc., and may also be accompanied by ionized species formed in the plasma. Sources of oxygen may also be combined with the more stable nitrogen precursor in the remote plasma which will act to pre-load the film with oxygen while decreasing flowability. Sources of oxygen may include one or more of $O_2$, $H_2O$, $O_3$, $H_2O_2$, $N_2O$, NO or $NO_2$.

In embodiments employing a chamber plasma region, the radical-nitrogen precursor is generated in a section of the substrate processing region partitioned from a deposition region where the precursors mix and react to deposit the silicon-and-nitrogen-containing layer on a deposition substrate (e.g., a semiconductor wafer). The radical-nitrogen precursor may also be accompanied by a carrier gas such as hydrogen ($H_2$), nitrogen ($N_2$), helium, etc. The substrate processing region may be described herein as "plasma-free" during the growth of the silicon-nitrogen-and-hydrogen-containing layer and during the low temperature ozone cure. "Plasma-free" does not necessarily mean the region is devoid of plasma. The borders of the plasma in the chamber plasma region are hard to define and may encroach upon the substrate processing region through the apertures in the showerhead. In the case of an inductively-coupled plasma, e.g., a small amount of ionization may be initiated within the substrate processing region directly. Furthermore, a low intensity plasma may be created in the substrate processing region without eliminating the flowable nature of the forming film. All causes for a plasma having much lower ion density than the chamber plasma region during the creation of the radical nitrogen precursor do not deviate from the scope of "plasma-free" as used herein.

In the substrate processing region, the carbon-free silicon precursor and the radical-nitrogen precursor mix and react to deposit a silicon-nitrogen-and-hydrogen-containing film on the deposition substrate 106. The deposited silicon-nitrogen-and-hydrogen-containing film may deposit conformally with some recipe combinations in embodiments. In other embodiments, the deposited silicon-nitrogen-and-hydrogen-containing film has flowable characteristics unlike conventional silicon nitride ($Si_3N_4$) film deposition techniques. The flowable nature during formation allows the film to flow into narrow features before solidifying.

Nitrogen in the silicon-nitrogen-and-hydrogen-containing film may originate from either (or both) of the radical precursor or the unexcited precursor. The carbon-free silicon-containing precursor may be essentially nitrogen-free, in some embodiments. However, in other embodiments, both the carbon-free silicon-containing precursor and the radical-nitrogen precursor contain nitrogen. In a third suite of embodiments, the radical precursor may be essentially nitrogen-free and the nitrogen for the silicon-nitrogen-and-hydrogen-containing layer may be supplied by the carbon-free silicon-containing precursor. As a result, the radical precursor may be referred to herein as a "radical-nitrogen-and/or-hydrogen precursor," which means that the precursor contains nitrogen and/or hydrogen. Analogously, the precursor flowed into the plasma region to form the radical-nitrogen-and/or-hydrogen precursor may be referred to as a nitrogen-and/or-hydrogen-containing precursor. This nomenclature may be applied to each of the embodiments disclosed herein. In embodiments, the nitrogen-and/or-hydrogen-containing precursor comprises hydrogen ($H_2$) while the radical-nitrogen-and/or-hydrogen precursor comprises .H, etc.

Returning to the specific example shown in FIG. 1, the flowability of a silicon-nitrogen-and-hydrogen-containing film may be due to a variety of properties which result from mixing a radical-nitrogen precursors with a carbon-free silicon-containing precursor. These properties may include a significant hydrogen component in the deposited film and/or the presence of short chained polysilazane polymers. These short chains grow and network to form more dense dielectric material during and after the formation of the film. For example the deposited film may have a silazane-type, Si—NH—Si backbone (i.e., a carbon-free Si—N—H film). When both the silicon-containing precursor and the radical precursor are carbon-free, the deposited silicon-nitrogen-and-hydrogen-containing film is also substantially carbon-free. Of course, "carbon-free" does not necessarily mean the film lacks even trace amounts of carbon. Carbon contaminants may be present in the precursor materials that find their way into the deposited silicon-and-nitrogen-containing precursor. The amount of these carbon impurities however are much less than would be found in a silicon precursor having a carbon moiety (e.g., TEOS, TMDSO, etc.).

The deposition substrate is cured in ozone following the deposition of the silicon-nitrogen-and-hydrogen-containing layer. The curing stage involves exposing the silicon-nitrogen-and-hydrogen-containing layer to an ozone-containing atmosphere 108. Ozone is generated outside the substrate processing region, in embodiments, and flowed into the substrate processing region. Plasma power may or may not be applied to the substrate processing region to further excite the ozone atmosphere in different embodiments of the invention. Absence of plasma, in embodiments, avoids generation of atomic oxygen which would close the near surface network and thwart subsurface oxidation. The reduction of nitrogen and increase in oxygen occurs not only near the surface, but also in the subsurface region due to the ability of relatively stable ozone to penetrate the open network of the silicon-nitrogen-and-hydrogen layer. A plasma may subsequently be applied to the substrate processing region to excite the ozone atmosphere in another stage of ozone curing in embodiments.

Next, assorted parameters are described which apply to the curing operation. The deposition substrate may remain in the substrate processing region for curing, or the substrate may be transferred to a different chamber where the ozone-containing atmosphere is introduced. The curing temperature of the substrate during either/both stages may be less than or about 300° C., less than or about 250° C., less than or about 225° C., or less than or about 200° C. in different embodiments. The temperature of the substrate may be greater than or about room temperature (25° C.), greater than or about 50° C., greater than or about 100° C., greater than or about 125° C. or greater than or about 150° C. in different embodiments. Any of the upper bounds may be combined with any of the lower bounds to form additional ranges for the substrate temperature according to additional disclosed embodiments. The flow rate of the ozone (just the ozone contribution) into the substrate processing region during the curing operation may be greater than 500 sccm, greater than 1 slm or greater than 2 slm in disclosed embodiments. The partial pressure of ozone during the curing operation may be greater than or about 20 Torr, greater than or about 30 Torr, greater than or about 50 Torr or greater than or about 100 Torr in disclosed embodiments.

The curing operation modified the silicon-nitrogen-and-hydrogen-containing layer into a silicon-and-oxygen-containing layer. The silicon-and-oxygen-containing layer is converted to silicon oxide by exposing the silicon-and-oxygen-containing layer to a humid environment (operation 110). The humid environment may be provided in the same region used for curing or the substrate may be moved to a separate processing station in disclosed embodiments. The humid environment may have a relative humidity greater than 50%, greater than 60%, greater than 70%, greater than 75%, greater than 80% or greater than 85% in embodiments of the invention. The substrate temperature may be between room temperature (25° C.) and about 100° C., between about 40° C. and about 95° C., between about 50° C. and about 90° C., 60° C. and about 90° C. or between about 70° C. and about 90° C. in embodiments. The duration of the humidity treatment may be less than 2 minutes, less than 5 minutes, less than 10 minutes, less than 30 minutes or less than an hour in embodiments of the invention.

The ozone curing operation typically takes place at higher substrate temperature than the humidity treatment. The curing operation and the humidity treatment may be carried out in separate chambers/stations, in embodiments, since these low temperatures are somewhat hard to precisely adjust within the same region. The inclusion of the low temperature humidity treatment described herein makes a high temperature oxygen atmosphere anneal (e.g. around 400° C. or higher) unnecessary. The curing operation in combination with the humidity treatment completes the silicon oxide conversion process in embodiments of the invention. In other embodiments, only the humidity treatment is used to perform the conversion process. In either case, the removal of a high temperature oxygen treatment allows the conversion process to occur without oxidizing underlying layers. The absence of a high temperature anneal in an oxygen atmosphere enables integrated circuit manufacturers to stay within oxidation budgets. Removing these higher temperature oxygen anneals improves yield and performance of integrated circuit devices. Though an oxidizing anneal has been obviated by the invention described herein, a high temperature inert anneal may still be included, in embodiments, to densify the silicon oxide film. A high temperature anneal in an inert environment counts toward a thermal budget but not towards the more specific oxidation budget, each of which are determined for and associated with a particular process flow.

The ozone-containing atmospheres of the curing operation and the moisture content of the humidity treatment each provide oxygen to convert the silicon-nitrogen-and-hydrogen-containing film into the silicon oxide ($SiO_2$) film. The concentration of Si—O, Si—OH and Si—N bonds were analyzed using fourier-transform infrared spectroscopy (FTIR). The peaks and associated concentrations were found to change over time after only the ozone curing operation. The evolving properties of the film complicate the manufacturing process flow. The FTIR peaks did not evolve over time, in embodiments, after first an ozone cure and then a humidity treatment.

Figure 2:
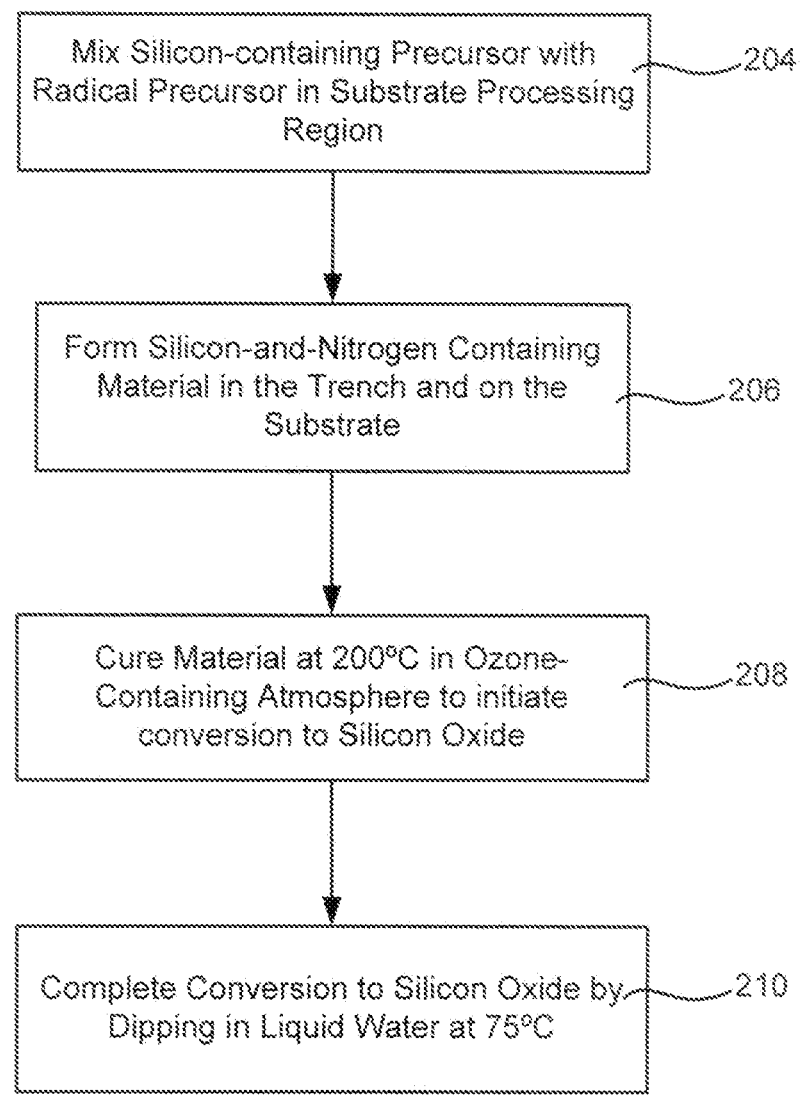
FIG. 2 is another flowchart illustrating selected steps for forming a silicon oxide film in a substrate gap according to embodiments of the invention.

Referring now to FIG. 2, another flowchart is shown illustrating selected steps in methods 200 for forming a silicon oxide film in a substrate gap according to embodiments of the invention. The substrate may have a plurality of gaps for the spacing and structure of device components (e.g., transistors) formed on the substrate. The gaps may have a height and width that define an aspect ratio (AR) of the height to the width (i.e., H/W) that is significantly greater than 1:1 (e.g., 5:1 or more, 6:1 or more, 7:1 or more, 8:1 or more, 9:1 or more, 10:1 or more, 11:1 or more, 12:1 or more, etc.). In many instances the high AR is due to small gap widths of that range from about 90 nm to about 22 nm or less (e.g., less than 90 nm, 65 nm, 50 nm, 45 nm, 32 nm, 22 nm, 16 nm, etc.).

A silicon-containing precursor is mixed with a radical precursor in the substrate processing region (operation 204). A flowable silicon-nitrogen-and-hydrogen-containing layer is deposited on the substrate (operation 206). Because the layer is flowable, it can fill gaps with high aspect ratios without creating voids or weak seams around the center of the filling material. For example, a depositing flowable material is less likely to prematurely clog the top of a gap before it is completely filled to leave a void in the middle of the gap.

The as-deposited silicon-nitrogen-and-hydrogen-containing layer may then be cured in a curing operation (208) having the same embodiments outlined in the description of operation 108 of FIG. 1. In this way, the silicon-nitrogen-and-hydrogen-containing layer is converted to a silicon-and-oxygen-containing layer.

The substrate is then transferred out of the ozone-containing atmosphere and the silicon-and-oxygen-containing layer is dipped into a liquid solution (operation 210) comprising both oxygen and hydrogen to complete the conversion to a silicon oxide layer. Further anneals in an oxygen-containing environment are not necessary, in embodiments of the invention, due to the presence of the liquid solution step. Ozone curing and dipping the resulting film in the liquid bath, as described herein, produces a silicon oxide layer on the substrate, including the substrate gap 208. As noted above, the silicon oxide layer has fewer pores and less volume reduction than similar layers formed with carbon-containing precursors that have significant quantities of carbon present in the layer before the heat treatment step. In many cases, the volume reduction is slight enough (e.g., about 15 vol. % or less) to avoid post heat treatment steps to fill, heal, or otherwise eliminate spaces that form in the gap as a result of the shrinking silicon oxide. In some embodiments, the silicon oxide layer in the trench is substantially void-free.

The liquid bath, substrate and cured film may be held at the same temperature during the operation of dipping the cured film in the liquid bath. The liquid bath may be between room temperature (25° C.) and about 100° C., between about 40° C. and about 95° C., between about 50° C. and about 90° C., 60° C. and about 90° C. or between about 70° C. and about 90° C. in embodiments. The duration of the liquid bath immerson may be less than 2 minutes, less than 5 minutes, less than 10 minutes, less than 30 minutes, less than one hour, less than two hours or less than five hours in embodiments of the invention. Subsequent high temperature oxygen anneals have been found to be unnecessary, in embodiments of the invention, once a silicon-nitrogen-and-hydrogen layer has been sequentially treated with an ozone cure and then a liquid bath as described herein. The inventors have further found that the liquid baths may be sufficient to transition a silicon-and-oxygen-containing layer to silicon oxide in some cases. Neither a preceding ozone cure nor a subsequent high temperature oxygen anneal was necessary to achieve silicon oxide. FTIR was used again to determine that such silicon oxide films did not display peak heights and locations which evolved over time after substrate processing was completed. FTIR results did not substantially change after substrate processing and while the substrate and films were being exposed to a typical cleanroom atmosphere.

The liquid bath or solution comprises oxygen and hydrogen and may include one or more of water, hydrogen peroxide or ammonium hydroxide. The silicon-and-oxygen film is dipped in the liquid solution and, in some embodiments, the substrate may be submerged in the liquid solution during dipping operation 210. The liquid solution may be SC1 or SC2 baths in embodiments. The liquid solutions may comprise deionized water, at least 10% ammonium hydroxide and at least 10% hydrogen peroxide. All percentages are given herein by volume. The liquid solution may comprise deionized water, at least 10% hydrochloric acid and at least 10% hydrogen peroxide. Other liquid baths may be created which contain both oxygen and hydrogen. The inventors have also discovered that the rate of conversion to silicon oxide is increased when the pH is lowered into the acidic range or raised into the basic range. Additional parameters may be introduced during the description of an exemplary silicon oxide deposition system.

Exemplary Silicon Oxide Deposition System

Deposition chambers that may implement embodiments of the present invention may include high-density plasma chemical vapor deposition (HDP-CVD) chambers, plasma enhanced chemical vapor deposition (PECVD) chambers, sub-atmospheric chemical vapor deposition (SACVD) chambers, and thermal chemical vapor deposition chambers, among other types of chambers. Specific examples of CVD systems that may implement embodiments of the invention include the CENTURA ULTIMA® HDP-CVD chambers/systems, and PRODUCER® PECVD chambers/systems, available from Applied Materials, Inc. of Santa Clara, Calif.

Examples of substrate processing chambers that can be used with exemplary methods of the invention may include those shown and described in co-assigned U.S. Provisional Patent App. No. 60/803,499 to Lubomirsky et al, filed May 30, 2006, and titled "PROCESS CHAMBER FOR DIELECTRIC GAPFILL," the entire contents of which is herein incorporated by reference for all purposes. Additional exemplary systems may include those shown and described in U.S. Pat. Nos. 6,387,207 and 6,830,624, which are also incorporated herein by reference for all purposes.

Figure 3:
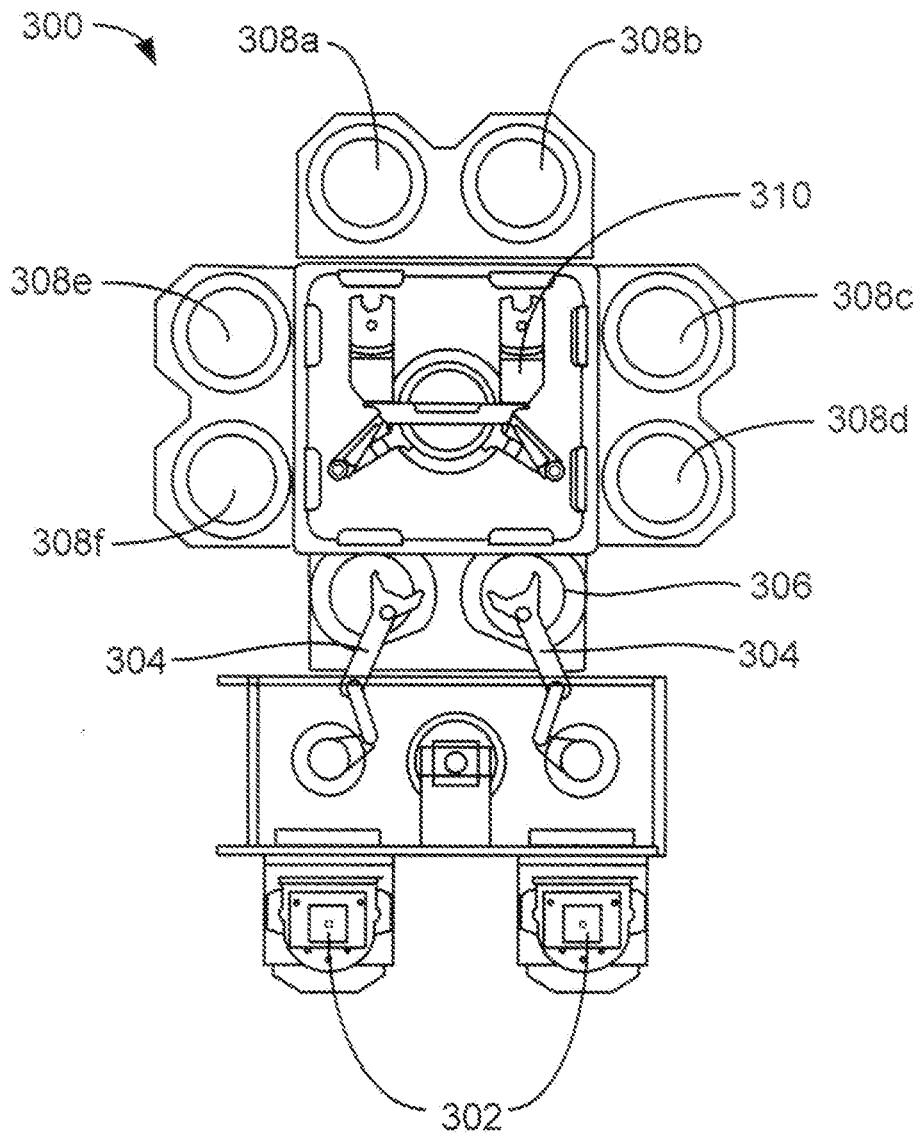
FIG. 3 shows a substrate processing system according to embodiments of the invention.

Embodiments of the deposition systems may be incorporated into larger fabrication systems for producing integrated circuit chips. FIG. 3 shows one such system 300 of deposition, baking and curing chambers according to disclosed embodiments. In the figure, a pair of FOUPs (front opening unified pods) 302 supply substrate substrates (e.g., 300 mm diameter wafers) that are received by robotic arms 304 and placed into a low pressure holding area 306 before being placed into one of the wafer processing chambers 308a-f. A second robotic arm 310 may be used to transport the substrate wafers from the holding area 306 to the processing chambers 308a-f and back.

The processing chambers 308a-f may include one or more system components for depositing, annealing, curing and/or etching a flowable dielectric film on the substrate wafer. In one configuration, two pairs of the processing chamber (e.g., 308c-d and 308e-f) may be used to deposit the flowable dielectric material on the substrate, and the third pair of processing chambers (e.g., 308a-b) may be used to anneal the deposited dielectric. In another configuration, the same two pairs of processing chambers (e.g., 308c-d and 308e-f) may be configured to both deposit and anneal a flowable dielectric film on the substrate, while the third pair of chambers (e.g., 308a-b) may be used for UV or E-beam curing of the deposited film. In still another configuration, all three pairs of chambers (e.g., 308a-f) may be configured to deposit and cure a flowable dielectric film on the substrate. In yet another configuration, two pairs of processing chambers (e.g., 308c-d and 308e-f) may be used for both deposition and UV or E-beam curing of the flowable dielectric, while a third pair of processing chambers (e.g. 308a-b) may be used for annealing the dielectric film. Any one or more of the processes described may be carried out on chamber(s) separated from the fabrication system shown in different embodiments.

In addition, one or more of the process chambers 308a-f may be configured as a wet treatment chamber. These process chambers include heating the flowable dielectric film in an atmosphere that includes moisture. Thus, embodiments of system 300 may include wet treatment chambers 308a-b and anneal processing chambers 308c-d to perform both wet and dry anneals on the deposited dielectric film.

Figure 4A:
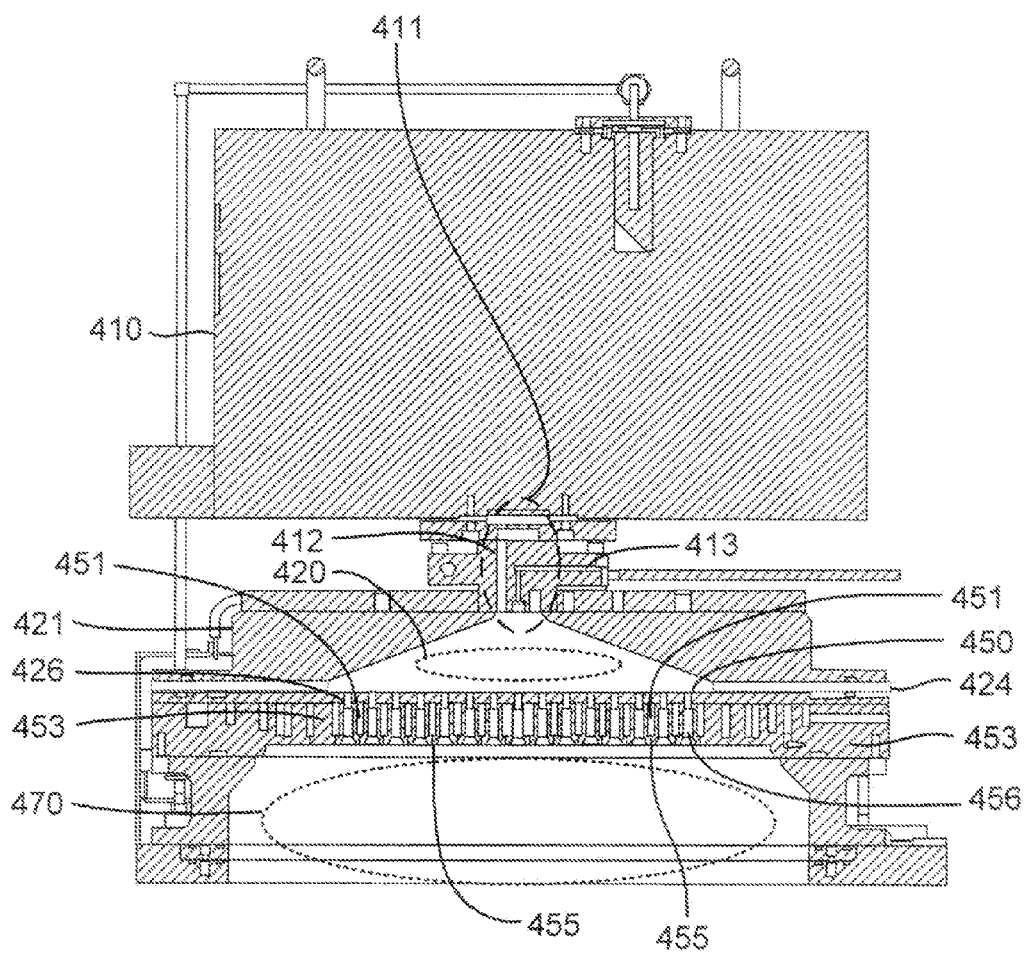
FIG. 4A shows a substrate processing chamber according to embodiments of the invention.

FIG. 4A is a substrate processing chamber 400 according to disclosed embodiments.

A remote plasma system (RPS) 410 may process a gas which then travels through a gas inlet assembly 411. Two distinct gas supply channels are visible within the gas inlet assembly 411. A first channel 412 carries a gas that passes through the remote plasma system (RPS) 410, while a second channel 413 bypasses the RPS 410. The first channel 412 may be used for the process gas and the second channel 413 may be used for a treatment gas in disclosed embodiments. The lid (or conductive top portion) 421 and a perforated partition (showerhead 453) are shown with an insulating ring 424 in between, which allows an AC potential to be applied to the lid 421 relative to showerhead 453. The process gas travels through first channel 412 into chamber plasma region 420 and may be excited by a plasma in chamber plasma region 420 alone or in combination with RPS 410. The combination of chamber plasma region 420 and/or RPS 410 may be referred to as a remote plasma system herein. The perforated partition (also referred to as a showerhead) 453 separates chamber plasma region 420 from a substrate processing region 470 beneath showerhead 453. Showerhead 453 allows a plasma present in chamber plasma region 420 to avoid directly exciting gases in substrate processing region 470, while still allowing excited species to travel from chamber plasma region 420 into substrate processing region 470.

Showerhead 453 is positioned between chamber plasma region 420 and substrate processing region 470 and allows plasma effluents (excited derivatives of precursors or other gases) created within chamber plasma region 420 to pass through a plurality of through-holes 456 that traverse the thickness of the plate. The showerhead 453 also has one or more hollow volumes 451 which can be filled with a precursor in the form of a vapor or gas (such as a silicon-containing precursor) and pass through small holes 455 into substrate processing region 470 but not directly into chamber plasma region 420. Showerhead 453 is thicker than the length of the smallest diameter 450 of the through-holes 456 in this disclosed embodiment. In order to maintain a significant concentration of excited species penetrating from chamber plasma region 420 to substrate processing region 470, the length 426 of the smallest diameter 450 of the through-holes may be restricted by forming larger diameter portions of through-holes 456 part way through the showerhead 453. The length of the smallest diameter 450 of the through-holes 456 may be the same order of magnitude as the smallest diameter of the through-holes 456 or less in disclosed embodiments.

In the embodiment shown, showerhead 453 may distribute (via through-holes 456) process gases which contain oxygen, hydrogen and/or nitrogen and/or plasma effluents of such process gases upon excitation by a plasma in chamber plasma region 420. In embodiments, the process gas introduced into the RPS 410 and/or chamber plasma region 420 through first channel 412 may contain one or more of oxygen ($O_2$), ozone ($O_3$), $N_2O$, NO, $NO_2$, $NH_3$, $N_xH_y$ including $N_2H_4$, silane, disilane, TSA and DSA. The process gas may also include a carrier gas such as helium, argon, nitrogen ($N_2$), etc. The second channel 413 may also deliver a process gas and/or a carrier gas, and/or a film-curing gas (e.g. $O_3$) used to remove an unwanted component from the growing or as-deposited film. Plasma effluents may include ionized or neutral derivatives of the process gas and may also be referred to herein as a radical-oxygen precursor and/or a radical-nitrogen precursor referring to the atomic constituents of the process gas introduced.

In embodiments, the number of through-holes 456 may be between about 60 and about 2000. Through-holes 456 may have a variety of shapes but are most easily made round. The smallest diameter 450 of through-holes 456 may be between about 0.5 mm and about 20 mm or between about 1 mm and about 6 mm in disclosed embodiments. There is also latitude in choosing the cross-sectional shape of through-holes, which may be made conical, cylindrical or a combination of the two shapes. The number of small holes 455 used to introduce a gas into substrate processing region 470 may be between about 100 and about 5000 or between about 500 and about 2000 in different embodiments. The diameter of the small holes 455 may be between about 0.1 mm and about 2 mm.

Figure 4B:
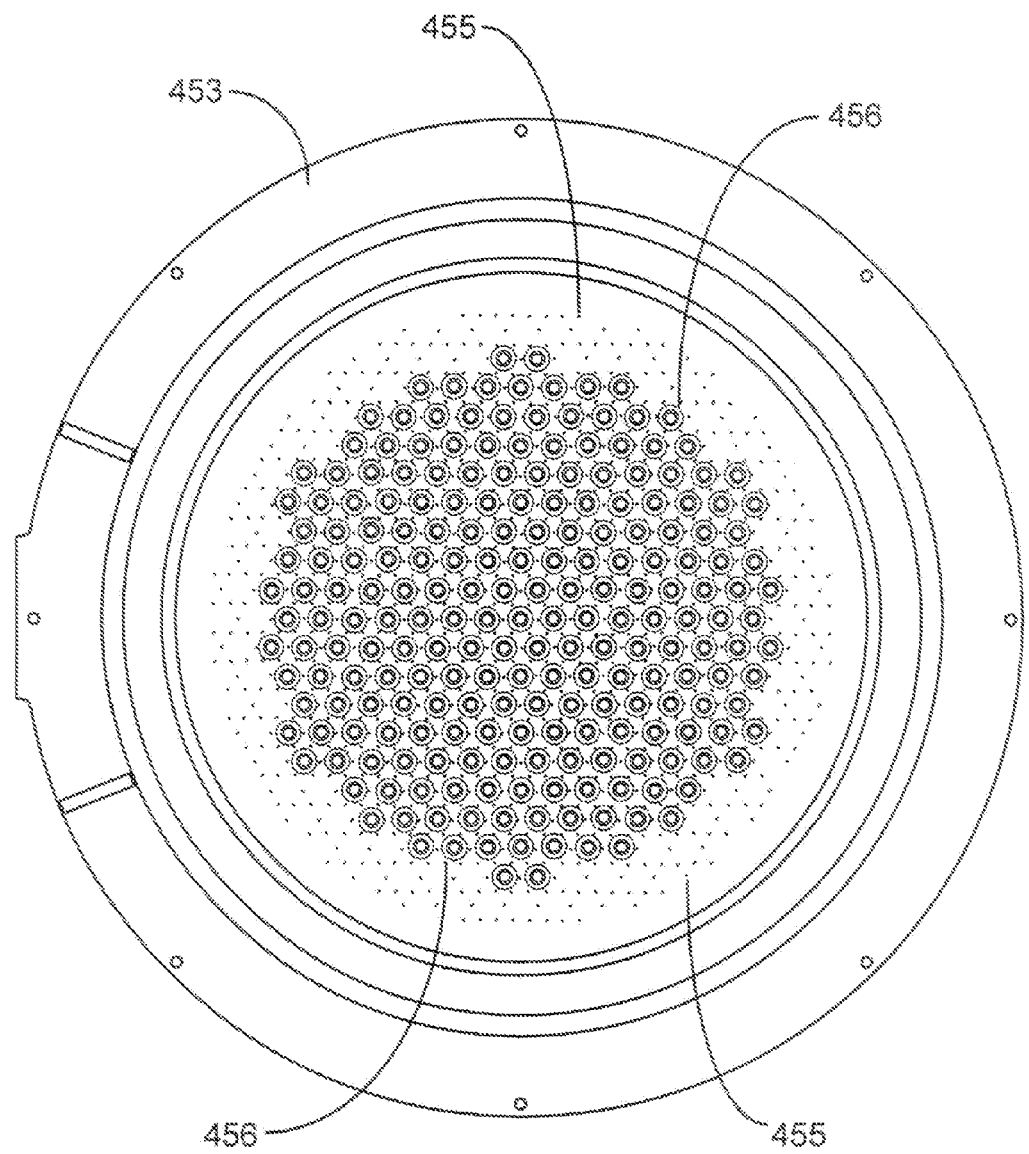
FIG. 4B shows a gas distribution showerhead according to embodiments of the invention.

FIG. 4B is a bottom view of a showerhead 453 for use with a processing chamber according to disclosed embodiments. Showerhead 453 corresponds with the showerhead shown in FIG. 4A. Through-holes 456 are depicted with a larger inner-diameter (ID) on the bottom of showerhead 453 and a smaller ID at the top. Small holes 455 are distributed substantially evenly over the surface of the showerhead, even amongst the through-holes 456 which helps to provide more even mixing than other embodiments described herein.

An exemplary film is created on a substrate supported by a pedestal (not shown) within substrate processing region 470 when plasma effluents arriving through through-holes 456 in showerhead 453 combine with a silicon-containing precursor arriving through the small holes 455 originating from hollow volumes 451. Though substrate processing region 470 may be equipped to support a plasma for other processes such as curing, no plasma is present during the growth of the exemplary film.

A plasma may be ignited either in chamber plasma region 420 above showerhead 453 or substrate processing region 470 below showerhead 453. A plasma is present in chamber plasma region 420 to produce the radical nitrogen precursor from an inflow of a nitrogen-and-hydrogen-containing gas. An AC voltage typically in the radio frequency (RF) range is applied between the conductive top portion (lid 421) of the processing chamber and showerhead 453 to ignite a plasma in chamber plasma region 420 during deposition. An RF power supply generates a high RF frequency of 13.56 MHz but may also generate other frequencies alone or in combination with the 13.56 MHz frequency.

The top plasma may be left at low or no power when the bottom plasma in the substrate processing region 470 is turned on during the second curing stage or clean the interior surfaces bordering substrate processing region 470. A plasma in substrate processing region 470 is ignited by applying an AC voltage between showerhead 453 and the pedestal or bottom of the chamber. A cleaning gas may be introduced into substrate processing region 470 while the plasma is present.

The pedestal may have a heat exchange channel through which a heat exchange fluid flows to control the temperature of the substrate. This configuration allows the substrate temperature to be cooled or heated to maintain relatively low temperatures (from room temperature through about 120° C.). The heat exchange fluid may comprise ethylene glycol and water. The wafer support platter of the pedestal (preferably aluminum, ceramic, or a combination thereof) may also be resistively heated in order to achieve relatively high temperatures (from about 120° C. through about 1100° C.) using an embedded single-loop embedded heater element configured to make two full turns in the form of parallel concentric circles. An outer portion of the heater element may run adjacent to a perimeter of the support platter, while an inner portion runs on the path of a concentric circle having a smaller radius. The wiring to the heater element passes through the stem of the pedestal.

The substrate processing system is controlled by a system controller. In an exemplary embodiment, the system controller includes a hard disk drive, a floppy disk drive and a processor. The processor contains a single-board computer (SBC), analog and digital input/output boards, interface boards and stepper motor controller boards. Various parts of CVD system conform to the Versa Modular European (VME) standard which defines board, card cage, and connector dimensions and types. The VME standard also defines the bus structure as having a 16-bit data bus and a 24-bit address bus.

The system controller controls all of the activities of the deposition system. The system controller executes system control software, which is a computer program stored in a computer-readable medium. Preferably, the medium is a hard disk drive, but the medium may also be other kinds of memory. The computer program includes sets of instructions that dictate the timing, mixture of gases, chamber pressure, chamber temperature, RF power levels, susceptor position, and other parameters of a particular process. Other computer programs stored on other memory devices including, for example, a floppy disk or other another appropriate drive, may also be used to instruct the system controller.

A process for depositing a film stack on a substrate, converting a film to silicon oxide or a process for cleaning a chamber can be implemented using a computer program product that is executed by the system controller. The computer program code can be written in any conventional computer readable programming language: for example, 68000 assembly language, C, C++, Pascal, Fortran or others. Suitable program code is entered into a single file, or multiple files, using a conventional text editor, and stored or embodied in a computer usable medium, such as a memory system of the computer. If the entered code text is in a high level language, the code is compiled, and the resultant compiler code is then linked with an object code of precompiled Microsoft Windows® library routines. To execute the linked, compiled object code the system user invokes the object code, causing the computer system to load the code in memory. The CPU then reads and executes the code to perform the tasks identified in the program.

The interface between a user and the controller is via a flat-panel touch-sensitive monitor. In the preferred embodiment two monitors are used, one mounted in the clean room wall for the operators and the other behind the wall for the service technicians. The two monitors may simultaneously display the same information, in which case only one accepts input at a time. To select a particular screen or function, the operator touches a designated area of the touch-sensitive monitor. The touched area changes its highlighted color, or a new menu or screen is displayed, confirming communication between the operator and the touch-sensitive monitor. Other devices, such as a keyboard, mouse, or other pointing or communication device, may be used instead of or in addition to the touch-sensitive monitor to allow the user to communicate with the system controller.

As used herein "substrate" may be a support substrate with or without layers formed thereon. The support substrate may be an insulator or a semiconductor of a variety of doping concentrations and profiles and may, for example, be a semiconductor substrate of the type used in the manufacture of integrated circuits. A layer of "silicon oxide" may include minority concentrations of other elemental constituents such as nitrogen, hydrogen, carbon and the like. In some embodiments, silicon oxide consists essentially of silicon and oxygen. The term "precursor" is used to refer to any process gas which takes part in a reaction to either remove material from or deposit material onto a surface. A gas in an "excited state" describes a gas wherein at least some of the gas molecules are in vibrationally-excited, dissociated and/or ionized states. A gas (or precursor) may be a combination of two or more gases (or precursors). A "radical precursor" is used to describe plasma effluents (a gas in an excited state which is exiting a plasma) which participate in a reaction to either remove material from or deposit material on a surface. A "radical-nitrogen precursor" is a radical precursor which contains nitrogen and a "radical-hydrogen precursor" is a radical precursor which contains hydrogen. The phrase "inert gas" refers to any gas which does not form chemical bonds when etching or being incorporated into a film. Exemplary inert gases include noble gases but may include other gases so long as no chemical bonds are formed when (typically) trace amounts are trapped in a film.

The term "trench" is used throughout with no implication that the etched geometry has a large horizontal aspect ratio. Viewed from above the surface, trenches may appear circular, oval, polygonal, rectangular, or a variety of other shapes. The term "via" is used to refer to a low aspect ratio trench which may or may not be filled with metal to form a vertical electrical connection. As used herein, a conformal layer refers to a generally uniform layer of material on a surface in the same shape as the surface, i.e., the surface of the layer and the surface being covered are generally parallel. A person having ordinary skill in the art will recognize that the deposited material likely cannot be 100% conformal and thus the term "generally" allows for acceptable tolerances.

Having described several embodiments, it will be recognized by those of skill in the art that various modifications, alternative constructions, and equivalents may be used without departing from the spirit of the invention. Additionally, a number of well-known processes and elements have not been described in order to avoid unnecessarily obscuring the present invention. Accordingly, the above description should not be taken as limiting the scope of the invention.

Where a range of values is provided, it is understood that each intervening value, to the tenth of the unit of the lower limit unless the context clearly dictates otherwise, between the upper and lower limits of that range is also specifically disclosed. Each smaller range between any stated value or intervening value in a stated range and any other stated or intervening value in that stated range is encompassed. The upper and lower limits of these smaller ranges may independently be included or excluded in the range, and each range where either, neither or both limits are included in the smaller ranges is also encompassed within the invention, subject to any specifically excluded limit in the stated range. Where the stated range includes one or both of the limits, ranges excluding either or both of those included limits are also included.

As used herein and in the appended claims, the singular forms "a", "an", and "the" include plural referents unless the context clearly dictates otherwise. Thus, for example, reference to "a process" includes a plurality of such processes and reference to "the precursor" includes reference to one or more precursor and equivalents thereof known to those skilled in the art, and so forth.

Also, the words "comprise," "comprising," "include," "including," and "includes" when used in this specification and in the following claims are intended to specify the presence of stated features, integers, components, or steps, but they do not preclude the presence or addition of one or more other features, integers, components, steps, acts, or groups.

What is claimed is:

1. A method of forming a silicon oxide layer on a substrate, the method comprising:
    forming a silicon-nitrogen-and-hydrogen-containing layer by:
    flowing an unexcited precursor into a remote plasma region to produce a radical-precursor,
    combining a silicon-containing precursor with the radical-precursor in a plasma-free substrate processing region, and
    depositing the silicon-nitrogen-and-hydrogen-containing layer on the substrate;
    curing the silicon-nitrogen-and-hydrogen-containing layer in an ozone-containing atmosphere to convert the silicon-nitrogen-and-hydrogen-containing layer to a silicon-and-oxygen-containing layer; and
    exposing the silicon-and-oxygen-containing layer to a humid atmosphere having at least 50% relative humidity to convert the silicon-and-oxygen-containing layer to a silicon oxide layer, wherein the substrate temperature is greater than 25° C. and less than 100° C. during the exposing operation.

2. The method of claim 1 wherein the humid atmosphere has at least 75% relative humidity.

3. The method of claim 1 wherein the substrate temperature is greater than 125° C. and less than 225° C. during the curing operation.

4. The method of claim 1 wherein the operation of exposing the silicon-and-oxygen-containing layer to the humid atmosphere lasts less than five hours.

5. The method of claim 1 wherein the operation of exposing the silicon-and-oxygen-containing layer to the humid atmosphere lasts less than two hours.

6. The method of claim 1 wherein the silicon oxide layer consists essentially of silicon and oxygen.

7. The method of claim 1 wherein the silicon-nitrogen-and-hydrogen-containing layer is flowable during deposition.

8. The method of claim 1 wherein the substrate is patterned and has a trench having a width of about 50 nm or less.

9. The method of claim 1 wherein the silicon-containing precursor and the silicon-nitrogen-and-hydrogen-containing layer are each carbon-free.

10. The method of claim 1 wherein the unexcited precursor comprises at least one of $N_2H_4$, $NH_3$, $N_2$ and $H_2$.

11. The method of claim 1 wherein the silicon-containing precursor comprises $N(SiH_3)_3$.

* * * * *